United States Patent
Leung et al.

(10) Patent No.: US 8,946,868 B2
(45) Date of Patent: Feb. 3, 2015

(54) MULTIPLE DIE LAYOUT FOR FACILITATING THE COMBINING OF AN INDIVIDUAL DIE INTO A SINGLE DIE

(75) Inventors: Ka Y. Leung, Austin, TX (US); Jean-Luc Nauleau, Los Gatos, CA (US)

(73) Assignee: Silicon Laboratories Inc., Austin, TX (US)

( * ) Notice: Subject to any disclaimer, the term of this patent is extended or adjusted under 35 U.S.C. 154(b) by 969 days.

(21) Appl. No.: 12/571,096

(22) Filed: Sep. 30, 2009

(65) Prior Publication Data

US 2011/0073996 A1 Mar. 31, 2011

(51) Int. Cl.
- H01L 29/72 (2006.01)
- H01L 23/495 (2006.01)
- H01L 23/52 (2006.01)
- H01L 23/58 (2006.01)
- H01L 23/00 (2006.01)

(52) U.S. Cl.
CPC ...... *H01L 23/49575* (2013.01); *H01L 23/4952* (2013.01); *H01L 23/52* (2013.01); *H01L 23/585* (2013.01); *H01L 24/73* (2013.01); H01L 2224/40 (2013.01); H01L 2224/48106 (2013.01); H01L 2224/48137 (2013.01); H01L 2224/48247 (2013.01); H01L 2224/48257 (2013.01); H01L 2224/49171 (2013.01); H01L 2924/01082 (2013.01); H01L 2924/19041 (2013.01); *H01L 24/48* (2013.01); *H01L 24/49* (2013.01); H01L 2924/01033 (2013.01)
USPC ............................ 257/620; 257/676; 257/786

(58) Field of Classification Search
USPC .......................... 257/620, 676, 786
See application file for complete search history.

(56) References Cited

U.S. PATENT DOCUMENTS

2008/0252372 A1* 10/2008 Williams ...................... 330/251

* cited by examiner

*Primary Examiner* — Edward Wojciechowicz
(74) *Attorney, Agent, or Firm* — Trop, Pruner & Hu, P.C.

(57) ABSTRACT

A semiconductor wafer including a plurality of die fabricated therein in a defined pattern. They are separated from each other by a dicing area or street and at least a portion of adjacent die on the wafer include at least a conductive connection between given adjacent die that is electrically interfaced to circuitry disposed on the given adjacent die.

10 Claims, 9 Drawing Sheets

MULTIPLE DIE LAYOUT FOR FACILITATING THE COMBINING OF AN INDIVIDUAL DIE INTO A SINGLE DIE

CROSS-REFERENCE TO RELATED APPLICATIONS

N/A

TECHNICAL FIELD

The present invention pertains in general to methods for patterning die configurations on a wafer and, more particularly, to a die layout method allowing the option of multiple die to be combined into a single die during dicing.

BACKGROUND

Conventional integrated circuits are configured with one or more dies disposed in the integrated circuit package. Sometimes, it is desirable to have multiple functions on an integrated circuit that are difficult to fabricate on a single die. The reason for this is that some processes are not compatible, such as a low voltage CMOS process and a high voltage CMOS process. It is sometimes easier to utilize two different die for this operation (also requiring different wafers fabricated with different processes). Sometimes, a low voltage process is utilized to fabricate a microcontroller unit that has both analog and digital functionalities associated therewith and, when utilized in a high voltage application such as a power supply controller, it is desirable to have contained within the same package driving transistors. These driving transistors are typically processed with a higher voltage process and it is easier to utilize two die in the package as opposed to attempting to fabricate the entire structure on a single integrated circuit. Another reason to utilize two die is to facilitate diversity among an offered product line. It may be desirable, for example, to provide multiple memory options for a packaged device and, rather than manufacturing single die devices, each with a separate memory capacity which requires multiple different wafers, it may be easier to merely utilize a common microcontroller design and combine it with different memory chips in a single package device utilizing multiple die. This, of course, depends upon demand. Another reason to use multiple die is when a controller unit utilized in a power supply application. In this application, pulse width modulation techniques are utilized requiring driving transistors to drive the magnetics. In this situation, it is desirable to add both the controller function and the driving function in a single package device. These driving transistors are high voltage transistors that are typically not compatible with a process for manufacturing the controller. It is relatively easy to provide an option to a customer in a very timely manner by merely utilizing discrete transistor die within a package and use bond wires to interface these die with the controller die.

Another reason to utilize multiple die is to increase the number of channels for a multi-channel device. It may be that the die is designed with two channels of operation, these being RF channels or analog channels or even digital channels such as used in an isolator. Driver circuits could also be implemented in such a manner. If the die is manufactured with four channels, offering an 8 channel device or a 6 channel device would require either developing a separate die with that many channels or a large die with 8 channels that has only a small number of channels bonded out in one configuration and all channels bonded out in another configuration. However, a 4 channel device can be manufactured, for example, to provide 1 to 4 channels with a single die package or 6 to 8 channels with a two die device.

The problem with providing multiple die is that each die must have a separate power and ground supply connection in addition to possibly some bond out options for configuring the device. This requires an additional $V_{DD}$ for each chip, and mounting two die requires a large area.

SUMMARY

The present invention disclosed and claimed herein comprises, in one aspect thereof, a semiconductor wafer including a plurality of die fabricated therein in a defined pattern. They are separated from each other by a dicing area or street and at least a portion of adjacent die on the wafer include at least a conductive connection between given adjacent die that is electrically interfaced to circuitry disposed on the given adjacent die.

BRIEF DESCRIPTION OF THE DRAWINGS

For a more complete understanding, reference is now made to the following description taken in conjunction with the accompanying Drawings in which.

DETAILED DESCRIPTION

Figure 1:
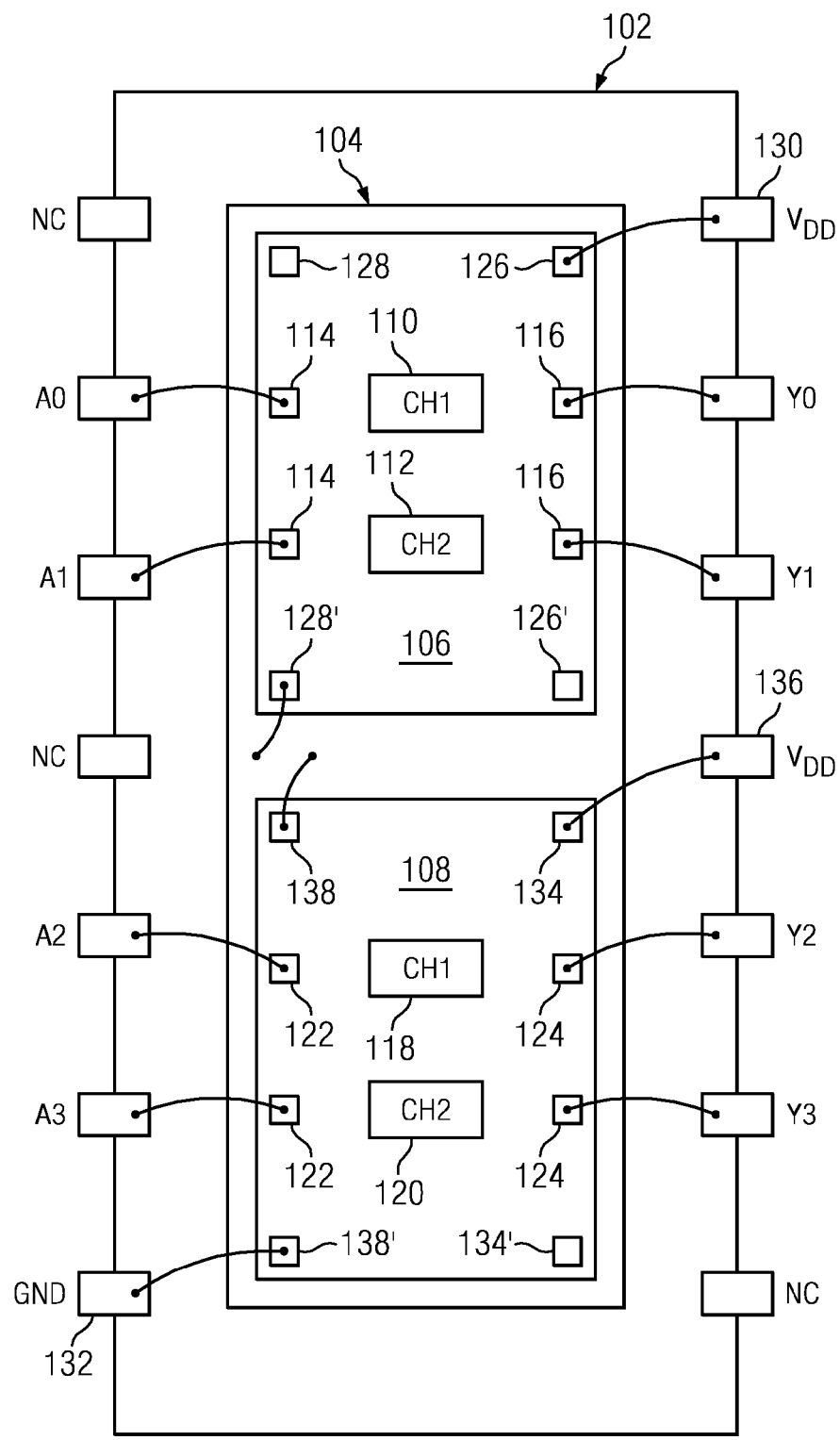
FIG. 1 illustrates a prior art diagram of a two die integrated circuit package device.

Referring now to the drawings, wherein like reference numbers are used herein to designate like elements throughout, the various views and embodiments of a multiple die layout for facilitating the combining of an individual die into a single die are illustrated and described, and other possible embodiments are described. The figures are not necessarily drawn to scale, and in some instances the drawings have been exaggerated and/or simplified in places for illustrative purposes only. One of ordinary skill in the art will appreciate the many possible applications and variations based on the following examples of possible embodiments.

Referring now to FIG. 1, there is illustrated a diagrammatic view of an integrated circuit package 102 having contained therein a lead frame 104 with two die 106 and 108 disposed thereon. Each of these die is illustrated as being a multichannel device, it being illustrated with only two channels. There is provided a first channel 110 and a second channel 112 disposed thereon. Each of these has respective bonding pads 114 has an input and 116 has an output associated therewith. Similarly, die 108 has a first channel 118 and a second channel 120 associated therewith respect to input bonding pads 122, and respective output bonding pads 124 associated therewith.

Both die 106 and 108 are mounted onto the lead frame 104 and separated there apart by as minimum a distance as possible for mounting. In addition, each die 106 and 108 will have power and ground bonding pads associated therewith. Typically, the $V_{DD}$ bonding pad configuration will incorporate multiple bonding pads on different corners to facilitate different packages. In this configuration, there are illustrated $V_{DD}$ bonding pads 126 and 126' on opposite corners of one side of the die 106, it being understood that more bonding pads could be utilized to bond out $V_{DD}$. There is also provided multiple ground bonding pads 128 and 128' on multiple corners, these being illustrated on the left side of the die 106. The bonding pad 106 for $V_{DD}$ is bonded out to a pin 130 on the integrated circuit package whereas the ground function is provided by a ground pin 132. Typically, the lead frame 104 is always grounded such that it will be directly connected to the ground pin 132 of the package. In this manner, all that is necessary is to bond out the ground bonding pads 128 or 128' to the lead frame 104. In this embodiment, it is illustrated that the bonding pad 128' is connected to the lead frame. The die 108 is configured similar to the die 106, since it is identical thereto in this embodiment. (It should be understood that different die could be utilized.) In this configuration, there are provided $V_{DD}$ bonding pads on one side of the die 108 labeled 134 and 134' with bonding pad 134 connected to $V_{DD}$ pin 136. There are provided two ground bonding pads 138 and 138' on the die 108 along the left side and corners thereof. Pad 138 is connected with the lead frame and pad 138' is illustrated as being connected to pin 132, although it should be understood that the lead frame could be directly connected to the ground pin 132.

It can be seen that the lead frame 104 must be sufficiently large enough to accommodate both die in addition to the fact that two $V_{DD}$ pins are required. In the configurations that utilize bond options for each of the chips, these options will also have to be accounted for, since each chip is independent of the other chip.

Figure 2:
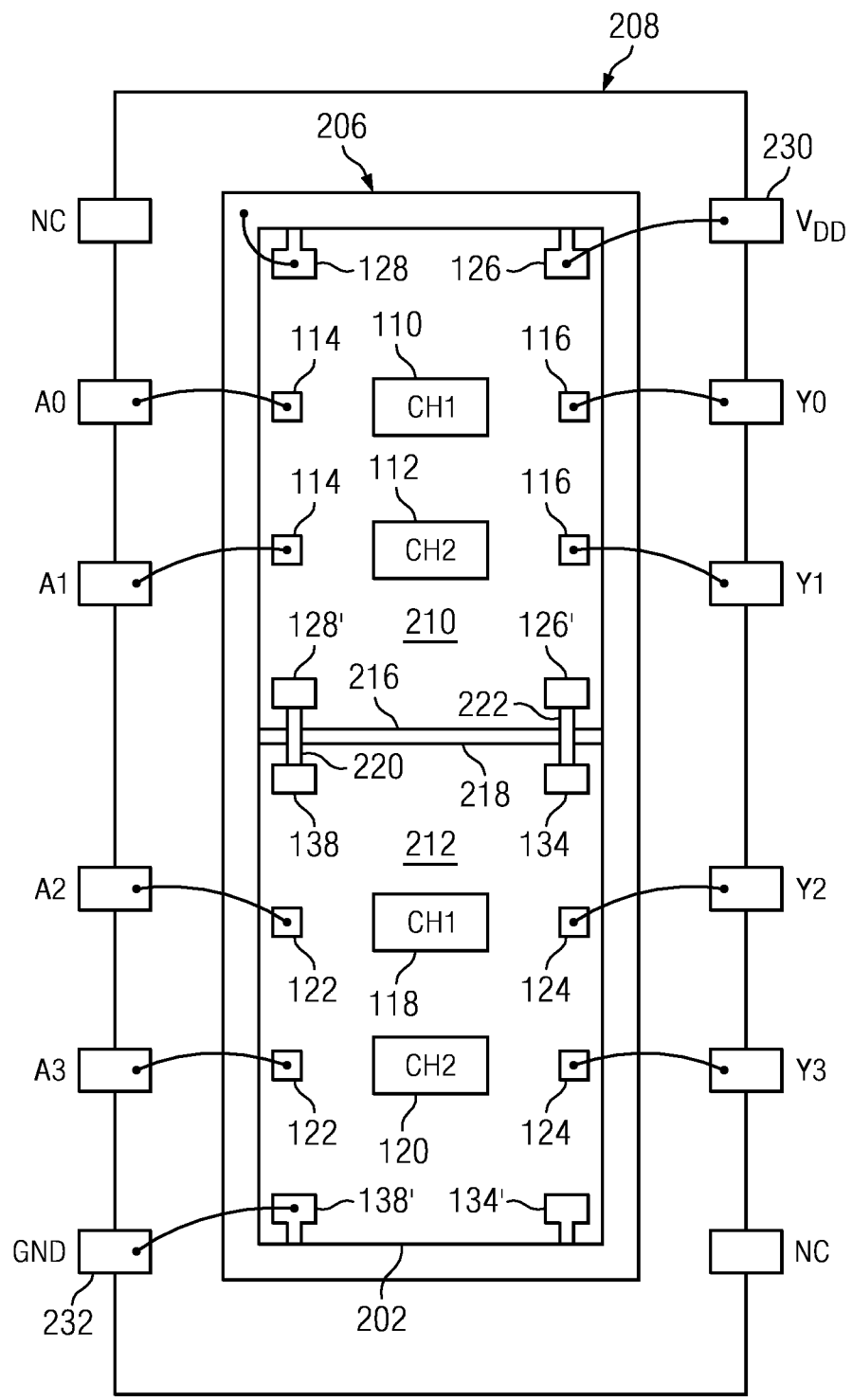
FIG. 2 illustrates a diagrammatic view of a packaged device wherein two die are combined into a single die within a package.

Referring now to FIG. 2, there is illustrated a diagrammatic view of two die combined onto a single die 202 and disposed on a lead frame 206 in an integrated circuit package 208. It should be understood that the package boundary defines an encapsulated lead frame/chip configuration although the encapsulation is not shown in any detail. It can be either resin based or a ceramic package. Each of the combined die will hereinafter be referred to as a "die" in this embodiment and the two individual dies combined into the larger die will be referred to as the "sub-die." In this embodiment, the die 202 is a combination die comprised of two sub-die 210 and 212. The sub-die 210 and 212 are identical to the die 106 and 108 of FIG. 1 and will utilize like numerals to refer to like parts in the respective embodiments. It can be seen that the bottom edge of sub-die 210 and the upper edge of sub-die 212 are defined by respective edges of a seal ring 216 for sub-die 210 and seal ring 218 for sub-die 212.

To interconnect the die, there is disposed on the wafer interconnections between the two sub-die 210 and 212. There is provided the interconnection 220 between ground bonding pad 128' on sub-die 210 and ground bonding pad 138 on sub-die 212. This interconnection 220 is a metal interconnect. Similarly, there is provided an interconnect 222 between $V_{DD}$ bonding pad 126' and $V_{DD}$ bonding pad 134'. In the package, the bonding pad 126 for $V_{DD}$ and sub-die 210 is bonded out to a $V_{DD}$ pin 230 and the ground pad 138' is grounded out to a ground pin 232. Thus, only a single $V_{DD}$ need be bonded out to provide power to both sub-die 210 and 212. Similarly, each of the channels is bonded out to pins corresponding to pins of FIG. 1 with different channels. These are illustrated with FIG. 1 and FIG. 2 as being input pins $A_0, A_1, A_2$ and $A_3$ for channel 1, channel 2, (110 and 112) on sub-die 210 and channel 1, channel 2, (118 and 120) on sub-die 212, respectively. Corresponding outputs are $Y_0, Y_1, Y_2$ and $Y_3$ on associated pins of the integrated circuit package in both FIG. 1 and FIG. 2. It can be seen that a smaller die bonding area is required on the lead frame 206 in addition to one less $V_{DD}$ pin as compared to the embodiment of FIG. 1.

Figure 3:
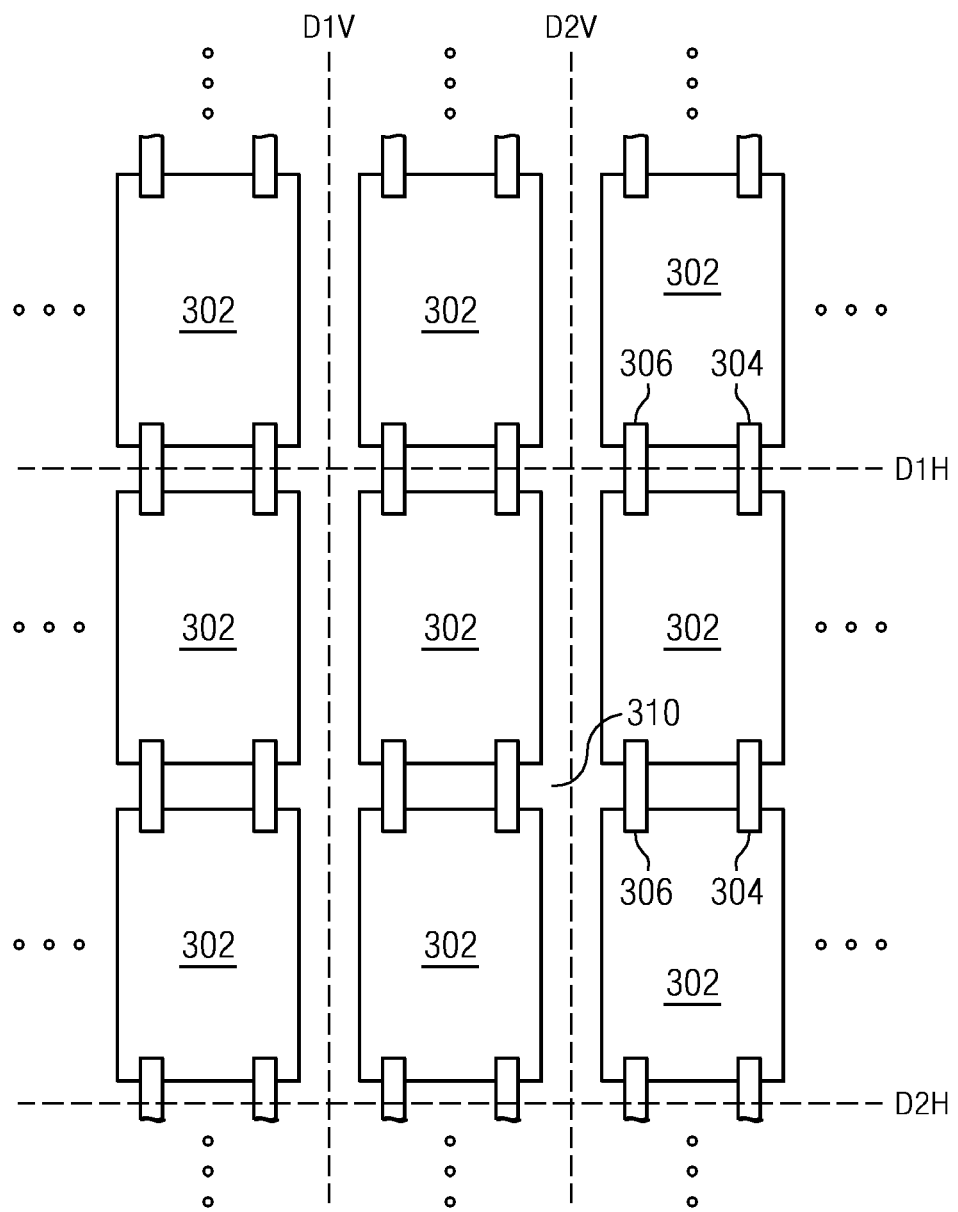
FIG. 3 illustrates a top view of a portion of a die in accordance with the present invention.
Figure 3A:
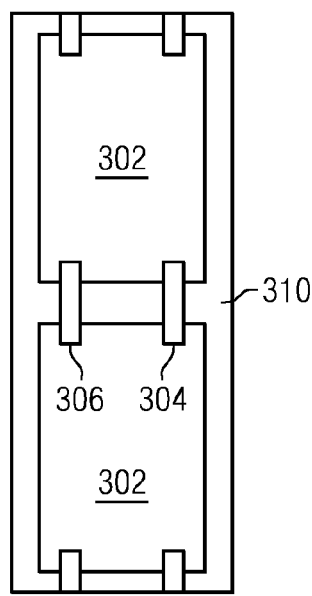
FIG. 3a illustrates a detail of a diced combined die from the wafer of FIG. 3.

Referring now to FIG. 3, there is illustrated a diagrammatic view of a portion of a wafer containing multiple identical die. Each of the die is noted with a reference numeral 302. The die are arranged in columns and rows and each die 302, which will be referred to as a sub-die, when combined in multiple die, is interconnected with the adjacent die in the same column with the two metal strips 304 and 306, in this embodiment representing power and ground. The wafer is diced along dicing lines in the vertical direction D1V and D2V (this being only a portion of the wafer illustrated) and in the horizontal direction along dicing lines D1h and D2h. This will result in a combination die 310 comprised of two sub-die 302. This combination die is illustrated in FIG. 3a. It can be seen that between the two sub-die 302, there remains intact the two metal interconnects 304 and 306. Thus, there will only be required the mounting of a single die in the package and the provision of a single ground and a single $V_{DD}$ connection for the combined sub-die 302. It should be understood that, although power and ground have been described, any type of signal could be provided to the interconnects. Further, the interconnects could be provided between adjacent die in a horizontal direction and, further, more than two die could be diced as a combination die to provide two or more die in a vertical direction and two or more die in a horizontal direction. The die could in fact be a 4×4 (or larger matrix) die.

Figure 4:
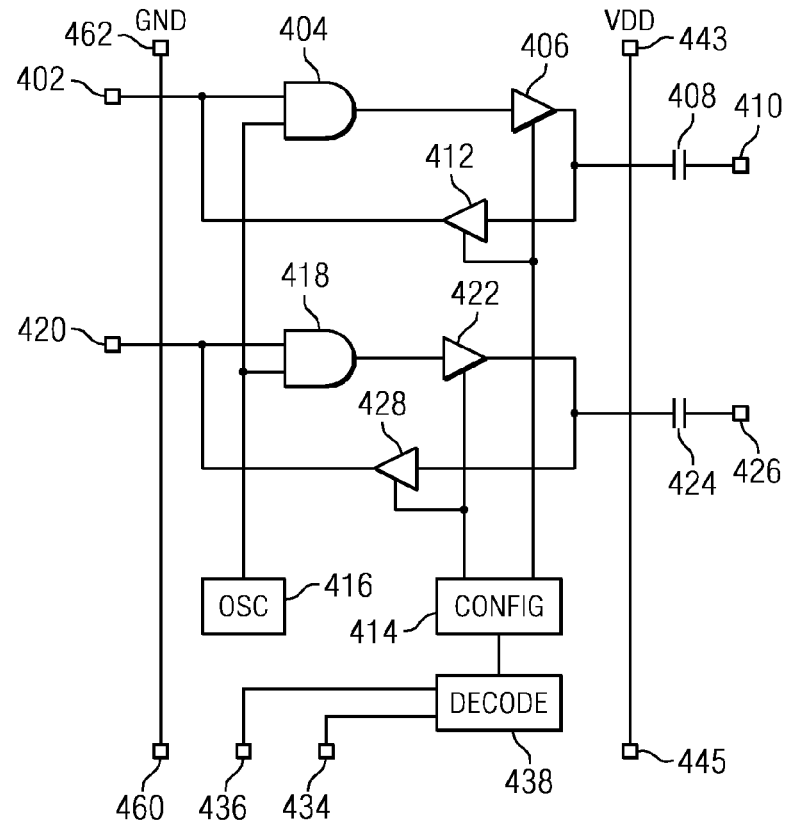
FIG. 4 illustrates a logic diagram for an exemplary embodiment of a multi-channel device that would be found on a single die.

Referring now to FIG. 4, there is illustrated a logic diagram of an exemplary multi-channel chip, this being an isolator chip. The isolator chip is utilized in an application where two sides of the integrated circuit package must be galvanically isolated from each other. This galvanic isolation is required because the isolator is disposed between the input and output of a switching power supply, for example. Thus, each side of the isolator must be disposed on a lead frame that is isolated from the other side and the interconnection therebetween must be via some type of isolated boundary such as a capacitor, inductor, or optical data link. In this embodiment, a capacitive isolator is illustrated. This capacitive isolator is described in detail in U.S. patent application Ser. No. 12/414, 379, filed Mar. 30, 2004 (Publication No. 2009/0213914), entitled CAPACITIVE ISOLATION CIRCUITRY, which is incorporated herein by reference in its entirety. Further, an inductor version thereof is described in U.S. Pat. No. 7,421, 028, issued Sep. 2, 2008, entitled TRANSFORMER ISOLA- TOR FOR DIGITAL POWER SUPPLY, which is also incorporated herein by reference in its entirety.

The illustrated isolator is a two channel isolator that provides bidirectional channels. The reason for this is that each channel requires two chips, one for receiving the input signal and driving one side of the capacitor on one side of the galvanic barrier and another chip for receiving a signal from the capacitor on the other side of the galvanic barrier and driving an output pad. Thus, one side of the galvanic barrier needs to be configured on the associated channel as a driver and the other side of the galvanic barrier of the same channelneeds to be configured as a receiver. Thus, each channel is bidirectional.

The first channel of the two channel device receives data on a data input/output pin 402 for input in a driving function to a gate 404 which drives a driver 406, the output thereof connected to one side of a capacitor 408, the other side thereof connected to a pad 410. This pad 410 is operable to be bonded to the complimentary chip on the other side of the galvanic barrier. As a receiver, a receiver 412 will have the input connected to the one side of the capacitor 408 and drive the pad 402. A configuration device 414 is provided to configure the channel as either a transmitter or a receiver. The gate 404 is operable to utilize the data to gate the output of an oscillator 416 to drive the transmitter 406 to provide an RF signal to the capacitor 408 which will be transmitted thereacross. When the data is at a logical "1," the oscillator output will be connected to the input of transmitter 406. This is referred to as ON/OFF key modulation.

The second channel is provided with a gate 418 having one input thereof connected to a data input/output pad 420 and the other input thereof connected to the output of the oscillator 416. The gate 418 drives a transmitter 422 which drives one side of a second capacitor 424 associated with the second channel, the other side of the capacitor 424 connected to a pad 426. A corresponding receiver 428 receives a signal from one side of the capacitor 424 across the galvanic barrier and drives the pad 420. Again, this channel is configured with the configuration device 414.

In configuring the device, the chip will have bond pads 434 and 436 associated therewith that drive a decoder 438. Decoder 438 is operable to determine whether the pads 434, 436 are connected to ground. This allows a configuration operation. The configuration defines whether the die is configured to the left side of the package or the right side of the package and whether it is a driver or a receiver. Since the identical chip is utilized for both sides, it can be understood that the corresponding die on this opposite side of the galvanic barrier will be rotated 180° such that the channel associated with pad 402 will be associated with pad 420 when utilized on the other side of the galvanic barrier. Thus, channel one on one side will be channel two on the other side. Thus, one portion of the coding will define it as a left or right, i.e., one bond pad, and the other will define whether it is a transmit or receive. Thus, only two bonding pads are required for this code. However, multiple bond pads could be used for a more complex coding operation.

Figure 4A:
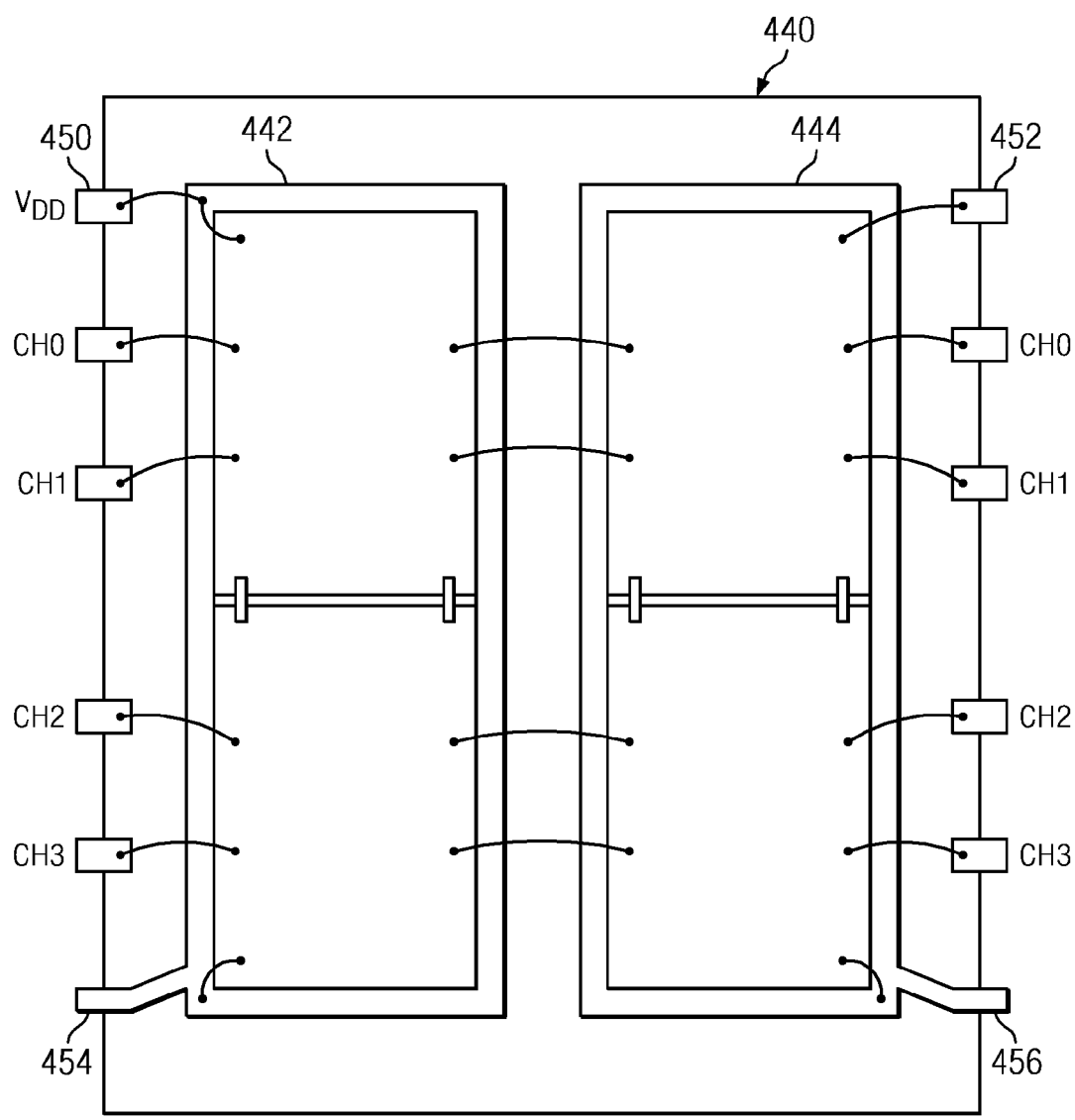
FIG. 4a illustrates a diagrammatic view of a combined two die integrated circuit used in an isolator configuration.

Referring now to FIG. 4a, there is illustrated a diagrammatic view of a package isolator utilizing the combination die such that, for example, a four channel device could be realized with two sub-die associated therewith, each sub-die being a two channel device. Integrated circuits defined by package 440 having two lead frames 442 and 444 associated therewith to define before galvanic isolation. The $V_{DD}$ pin is provided by two bonding pads 443 and 445 at either corner of one side of a sub-die and this is bonded on one side of the galvanic barrier, the left side, to a $V_{DD}$ pin 450 and to the other side to a $V_{DD}$ pin 452. These pads interface with various power lines and busses on the die and this will be referred to as a power mesh. This power may be distributed to all of the powered circuitry or it may be regulated down o another power bus or mesh. This provides a single $V_{DD}$ connection on either side, thus, requiring two $V_{DD}$ pins, one on each side of the package. The ground pin is provided on one side by a pin 454 which is connected to lead frame 442 and, on the other side of the barrier, a ground pin 456 connected to the lead frame 444. Thus, all that is required is to bond out a ground pad 460 or 462 on one of the sub-die to the respective lead frame 442 or 444. The bond configuration is not illustrated as being bonded out in this application. The pads 402 and 420 for each of the sub-die will be connected to respective channel inputs CH0, CH1, CH2 and CH3 on either side of the integrated circuit package.

Figure 5A:
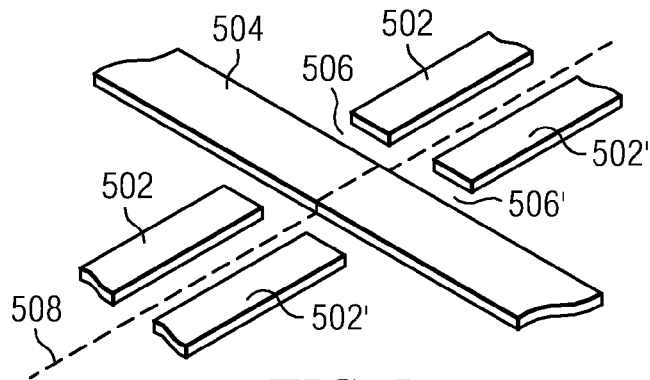
FIGS. 5a-5c illustrate a detail of the interconnection between two adjacent die to allow signal and/or power to run therebetween.
Figure 5B:
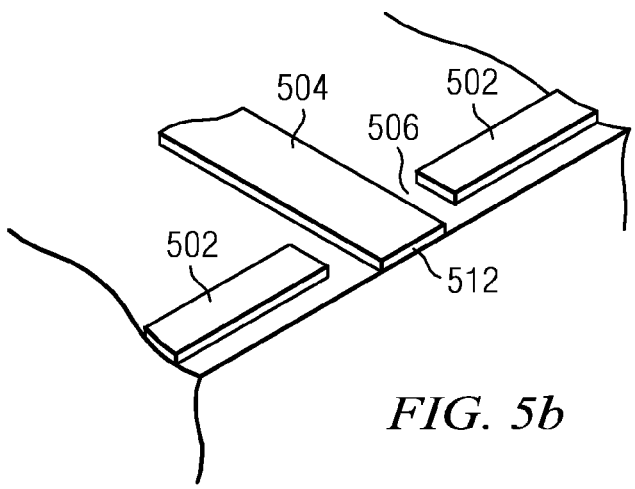
Figure 5C:
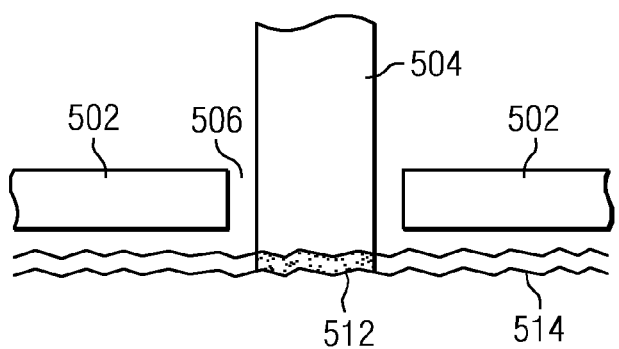

Referring now to FIGS. 5a, 5b and 5c, there is illustrated a diagrammatic view of the metal interconnect that is provided between adjacent die. Each of the sub-die has disposed upon the periphery thereof a "seal ring." This is configured by patterning each layer such that a ring is disposed in the pattern about the periphery of an integrated circuit. For example, in the metal layer M4, for example, there would be a pattern defined around the periphery of the integrated circuit. If vias were formed between M4 and M3, for example, then vias would be disposed therebetween. The reason for this is to prevent any kind of noise, etc. from interfering through the edges of the die. This is a conventional operation.

In the example illustrated, the seal ring is defined at the top layer, M6 in this example, such that the seal ring would define a metal pattern 502 around the peripheral on one sub-die and a metal pattern 502' on the adjacent die. There would be an interconnection 504 disposed between the boundary of the two die through a gap 506 in the seal ring 502 and a gap 506' in the seal ring 502'. This allows the interconnect 504 to be disposed therebetween. There is illustrated a dotted line 508 that represents the dicing line between the two chips. During dicing, a cut will be made between the two sub-die such that the die would be separated from each other and the interconnect 504 would be cut in half and would extend to the edge of the chip. Typically, there would be a passivation layer over the entire wafer that will cover all of the metal patterns. The result is that illustrated in FIG. 5b, showing that there will now be a rough edge 512 disposed on the end of the interconnect 504. Thus, the interconnect 504 extends to the edge of the die or chip and connects with nothing. Since this is the power line, this should not be a problem as no signal is typically disposed thereacross. FIG. 5c illustrates a top view of this operation and it can be seen that there will be a jagged cut 514 disposed on the edge, this representing the area where the passivation layer will be disrupted. It can also be seen that, during the dicing operation, there will be some contaminants disposed in the edge of the interconnect 504 which will not be a problem, as the remainder of the chip is protected by the passivation layer.

Figure 6:
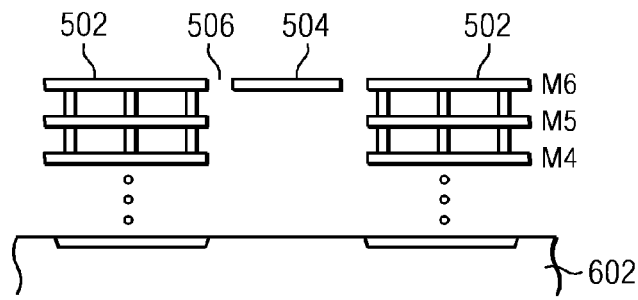
FIG. 6 illustrates a cross-sectional view of the die edge.

Referring now to FIG. 6, there is illustrated an edge view of the chip of FIGS. 5a-5c. This illustrates the seal ring 502 and the interconnect 504. As noted herein above, the interconnect 504 is disposed within a gap 506 in the seal ring. It can be seen that a gap is illustrated as being disposed in all portions of the seal ring extending from the top layer, the M6 layer in this example, all the way down through all the metal and insulating layers to the surface of a substrate 602. However, it should be understood that only the M6 layer needs to have the gap disposed therein and the M5 layer and subsequent layers could be continuous such that any diffusions or implantations in the surface of the substrate could be extended all the way under the interconnect 504 and all layers M5, M4, etc. could be extended under the layer to the interconnect 504. Further, the interconnect 504 need not be in the top layer; rather, it could be in any intermediate layer disposed within the substrate. However, for power and ground, the top layer is typically utilized. Another reason to dispose this in the top layer is that it may be desirable to have two wafers, one with interconnects for multiple die dicing and one without interconnects for single die dicing which will not be utilized for multiple die configuration. This requires only a single mask change which is easily facilitated at the top level mask.

Figure 7A:
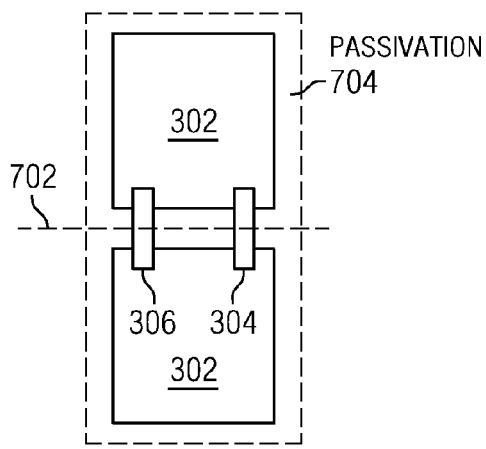
FIGS. 7a-7c illustrate a diagrammatic view of the passivation layer over the die.
Figure 7B:
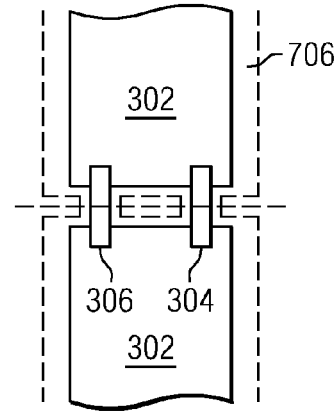
Figure 7C:
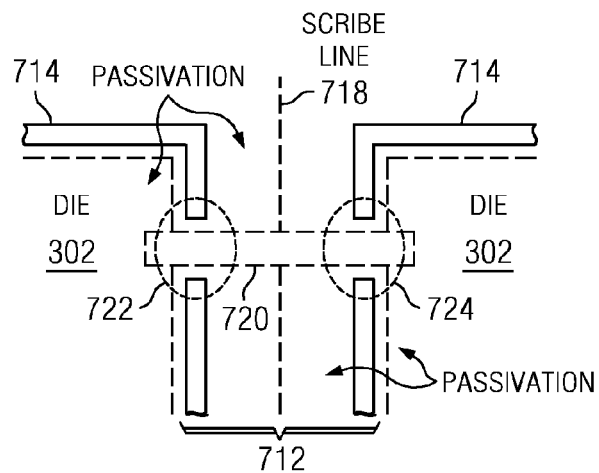

Referring now to FIGS. 7a, 7b and 7c, there are illustrated diagrammatic views of different passivation techniques. In FIG. 7a, there are illustrated two sub-die 302 with the interconnects 304 and 306 illustrated with a dicing line 702 disposed therebetween. In this configuration, a passivation layer 704 is provided over the entire wafer such that the entirety of the space between the two sub-die 302 is covered by the passivation layer as well as the sub-die 302 themselves. In FIG. 7b, a different passivation technique is utilized. In this technique, a wafer manufacturer, for example, desires not to have passivation disposed in the space between sub-die 302, as some manufacturers feel that the passivation along the dicing line will crack and cause the passivation layer over the sub-die 302 to also crack. In this configuration, a passivation layer 706 would be provided that extends over only the interconnects 304 and 306 in the dicing area.

Referring now to FIG. 7c, there is illustrated an embodiment where there are provided the two sub-die 302 which are separated by a gap or street 712. The edge of the die 302 is disposed proximate each of these edges and defined by a dotted line. A passivation layer is disposed over the surface of the wafer such that passivation is disposed over each of the sub-die 302, and about the periphery thereof, there lies a gap 714 in the passivation layer. Therefore, there is a street 712 in the wafer between die and a gap 714 in the passivation layer such that the street 712 on the portion thereof not occupied by the gaps 714 that is covered by a layer of passivation. Without the interconnects disposed therein, this gap 714 would be disposed around the entire periphery of the die 302. The purpose for surrounding the die with this gap 714 is to facilitate scribing or dicing along the scribe line (represented by the vertical dotted line 718 in FIG. 7c) would result in cracking of the passivation. This cracking would extend over toward the sub-die 302 but would be stopped at the gap 714. Therefore, the gap 714 provides a protection for the portion of the passivation layer that is disposed over the die 302. However, when an interconnect 720 (dotted line) is disposed between the two sub-die 302, it is necessary to provide a passivation that extends over the interconnect 720 at an area 722 on one side of the scribe line 718 proximate to the gap 714 and an area 724 on the other side of the scribe line 718 proximate to the gap 714, these two areas 722 and 724 illustrated with circles. It can bee seen that this is only a very small area, which would present little problem to the protection of the overall passivation over the die 302. The gap 714 is only four microns in width and thus, the area covered by regions 722 and 724 would be very small. It is important to remember that the cracking only occurs when the line is scribed. Therefore, when not scribed, power can be conducted over the interconnect 720 (or signals) without any cracking thereover. When scribed, the only concern would be that a crack would extend through either region 722 or region 724 into the portion of the passivation layer over the sub-die 302.

Figure 8:
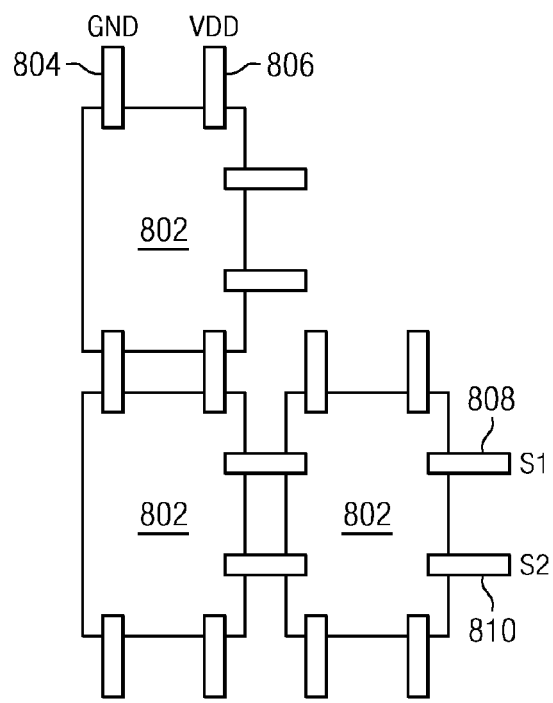
FIG. 8 illustrates a top view of a configuration wherein potential interconnections are made both vertically and horizontally.

Referring now to FIG. 8, there is illustrated an alternate diagrammatic view that utilizes multiple sub-die 802 disposed in rows and columns wherein there are provided interconnects 804 and 806 for ground and power along the vertical direction and there are also provided along the horizontal direction signal interconnects 808 and 810. These signal interconnects allow signals to be disposed between chips in the horizontal direction such that multiple die in the horizontal direction or four die in a matrix pattern could be configured to allow power and data to flow therebetween. Also, there could be power flowing in the horizontal direction for a matrix configured device. Thus, any combination of signal paths or power paths could be facilitated in the wafer by interconnecting across the dicing line between sub-dies.

Figure 9:
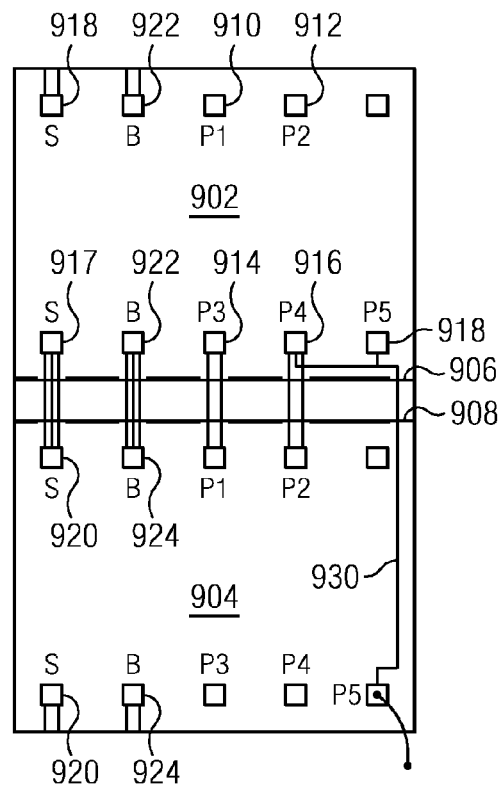
FIG. 9 illustrates a diagrammatic view of two die disposed in a combined configuration with both signal and bond out options connected together.

Referring now to FIG. 9, there is illustrated a diagrammatic view of two adjacent die along a wafer and the interconnection therebetween showing a combination die with interconnections of synchronization signals, bias signals and encoding signals. Sub-die are labeled 902 and 904. Sub-die 902 is the uppermost die and sub-die 904 is the lowermost die in the combination die. It can be seen that there is a seal ring remainder 906 associated with sub-die 902 and a seal ring remainder 908 associated with sub-die 904. There are provided on each of the sub-die contacts which are utilized to interconnect with adjacent sub-die. The oscillator function in the isolator provides the ability to synchronize with a master, i.e., each of the sub-dies is capable of operating as a slave. When in the slave mode, the resources of the master are utilized. Therefore, sub-die 902 would utilize its bias circuitry, i.e., a bandgap generator and various bias generators, to provide the bias to the slave, the lower sub-die 904. Since each of the sub-dies 902 and 904 are capable of operating independently, each has the ability to operate as a stand alone device, i.e., essentially in the master mode. In this mode, there would be no interconnection of the bias signal outwardly therefrom. Each of these has provided therefore five bond out pads to provide coding therefore, these labeled 910, 912, 914, 916 and 918, respectively. Each is labeled P1, P2, P3, P4 and P5, respectively. On sub-die 904, there are corresponding bond out pads P1-P5. There are also provided a sync pad 917 and sub-die 902 at each corner thereof on one side and corresponding sync pads 920 on sub-die 904. At the lower side of die 902 and the upper side of die 904, there will be an interconnection across the dicing line between the two sub-die. This will provide the synchronization signal. Similarly, there will be provided a bias interconnect pad 922 on each edge of sub-die 902 and the corresponding bias pad 924 on each edge of sub-die 904. The two bias pads 922 and 924 (it being understood that these are not pads but rather interconnect links) are interconnected together across the dicing line. Thus, when the die is not disposed in a combination, it will operate in a stand alone or master mode with no slave associated therewith. In this mode, it will need only four bond out options to provide the configuration data thereto. However, when both dies are in combination, the bit value of the decoder is required to be higher and, therefore, an additional bit, the P5 bit, will be utilized. In this mode, however, it is necessary for there to be some interaction or signaling between the two sub-dies, i.e., from the master sub-die 902 to the slave sub-die 904. This is facilitated by an interconnection 930 across the dicing line between the bond out pad P4 on sub-die 902 and the bond out pad P5 on sub-die 904. Pad P5 on sub-die 904 is then connected to ground such that both P5 on the master and slave die are connected to ground master die 902 are bonded out to ground. This indicates to the internal decode circuitry that the coding pins are now P1, P2 pads associated with sub-die 902 and the P3 and P4 bond out pads associated with sub-die 904. Similarly, this will also indicate to the circuitry that it is in slave mode and the bias circuitry and other such resources can be powered down on the slave device such that the power can be conserved. The master and slave combination can then utilize the two bond out option pads P3 and P4 on sub-die 904 and the two bond out option pads P1 and P2 on sub-die 902 for encoding. As noted with respect herein above to the isolator application, these bond out pads will indicate the direction of the channel and whether the die is on the left or right side of the new package. Any interconnection between the two decoders could also be provided such that the entire chip is functional as a single decoded part.

Figure 10:
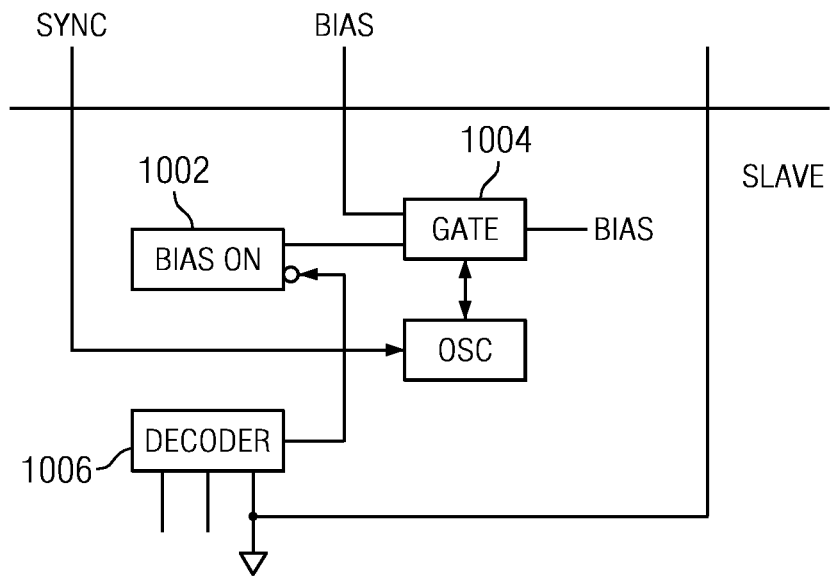
FIG. 10 illustrates a simplified diagram of the functional circuitry of the die of FIG. 9.

Referring now to FIG. 10, there is illustrated a diagrammatic view of the functional aspect of these two devices of FIG. 9. A bias circuit 1002 is provided that is operable to provide bias through a gate 1004 to the circuitry. The gate 1004 is controlled by an enable signal output by a decoder 1006. This enable signal will turn the bias generator 1002 off if it is in the slave mode and control the gate 1004 to select the external bias. The oscillator will also be placed in a synch mode which allows it to synchronize with the master oscillator. The decoder will provide one input thereto in communication across the die line to the master such that grounding of that decoder line will be reflected across the dicing line.

Figure 11:
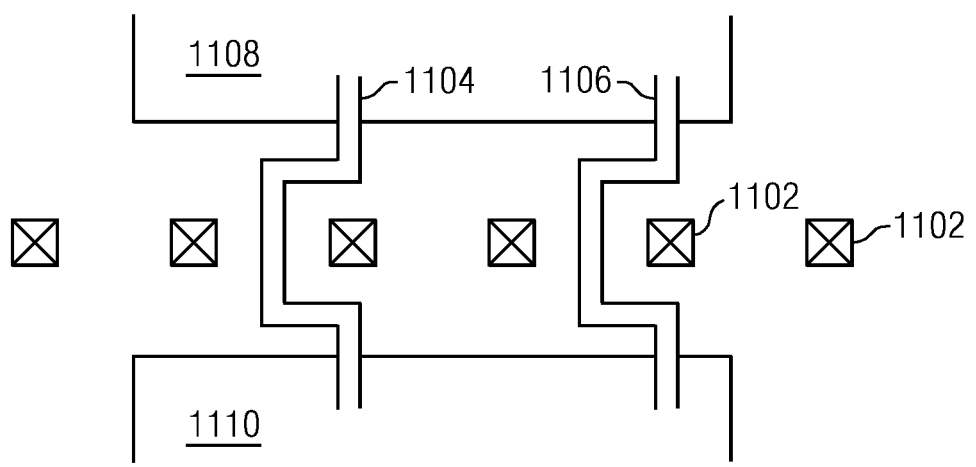
FIG. 11 illustrates an alternate embodiment of rerouting or interconnections between adjacent die on a wafer.

Referring now to FIG. 11, there is illustrated a diagrammatic view of an alternate dicing line wherein the dicing line provides a plurality of required metal areas 1102 therealong. It is necessary for the interconnects to be routed around these patterns in the manner shown with interconnects 1104 and 1106 to two sub-die 1108 and 1110.

It will be appreciated by those skilled in the art having the benefit of this disclosure that this multiple die layout for facilitating the combining of an individual die into a single die provides a package device with less pins. It should be understood that the drawings and detailed description herein are to be regarded in an illustrative rather than a restrictive manner, and are not intended to be limiting to the particular forms and examples disclosed. On the contrary, included are any further modifications, changes, rearrangements, substitutions, alternatives, design choices, and embodiments apparent to those of ordinary skill in the art, without departing from the spirit and scope hereof, as defined by the following claims. Thus, it is intended that the following claims be interpreted to embrace all such further modifications, changes, rearrangements, substitutions, alternatives, design choices, and embodiments.

What is claimed is:

1. A packaged integrated circuit, comprising:
   a lead frame having a plurality of pins associated therewith;
   a combination die mounted on the lead frame and including:
      at least first and second independent integrated circuits sharing a common bulk semiconductor substrate and each having separate and independent power supply interconnect meshes associated therewith to distribute power to circuitry thereon and bonding pads for independent power connection to the associated meshes; and
      at least one interconnect between the at least first and second independent integrated circuit interfaced with circuitry on each of the at least first and second independent integrated circuits;
   bond wires for interfacing select portions of the circuitry of each of the first and second independent integrated circuits to select ones of the pins; and
   an encapsulating material for encapsulating the lead frame, the combination die and at least a portion of the pins.

2. The packaged integrated circuit of claim 1, wherein the at least first and second independent integrated circuits are separated therefrom by an isolation region within the semiconductor substrate.

3. The packaged integrated circuit of claim 1, wherein there are two isolation regions, one associated with each of the first and second independent integrated circuits and separated from each other.

4. The packaged integrated circuit of claim 3, wherein the isolation regions comprise a portion of a seal ring disposed about the periphery of the respective first and second integrated circuits.

5. The packaged integrated circuit of claim 1, wherein the at least first and second independent integrated circuits are substantially identical circuits.

6. The packaged integrated circuit of claim 1, wherein the at least first and second independent integrated circuits comprise integrated circuits having different functionalities.

7. The packaged integrated circuit of claim 1, wherein the combination die comprises more than two independent integrated circuits disposed in either a column, a row or a matrix and adjacent dies therein having at least one interconnect disposed therebetween.

8. The packaged integrated circuit of claim 1, wherein the interconnect is disposed between power meshes of the at least first and second independent integrated circuits and each of these at least first and second independent integrated circuits has only one of the bond pads associated with the power connection thereto connected to a power input pin on the lead frame.

9. The packaged integrated circuit of claim 8, wherein there are provided at least two interconnects between the at least first and second independent integrated circuits and interfaced with both a power mesh on each of the integrated circuits and a ground mesh on each of the at least first and second integrated circuits wherein at least one ground pin on one of the at least first and second independent integrated circuits is connected to only one pin on the lead frame.

10. The packaged integrated circuit of claim 1, wherein the at least one interconnect between the at least first and second independent integrated circuits interfaces a signal between the circuitry of each of the at least first and second independent integrated circuits.

* * * * *